United States Patent [19]

Swanson

[11] Patent Number: 4,947,455
[45] Date of Patent: Aug. 7, 1990

[54] RF POWER SUPPLY FOR SUPPLYING A REGULATED POWER AMPLIFIED UNMODULATED DRIVE SIGNAL TO AN RF MODULATOR

[75] Inventor: Hilmer I. Swanson, Quincy, Ill.

[73] Assignee: Harris Corporation, Melbourne, Fla.

[21] Appl. No.: 269,158

[22] Filed: Nov. 9, 1988

[51] Int. Cl.$^5$ .................. H04B 17/00; H03C 1/00
[52] U.S. Cl. .................. 455/115; 455/117; 332/151; 332/119
[58] Field of Search ............. 455/127, 115, 117; 333/100, 101, 103; 332/41, 151, 150, 118, 119; 323/284; 330/128, 129, 279, 285

[56] References Cited

U.S. PATENT DOCUMENTS

| | | | |
|---|---|---|---|
| 3,379,960 | 4/1968 | May | 323/262 |
| 3,419,788 | 12/1968 | May | 323/262 |
| 3,815,048 | 6/1974 | Hamlet | 331/109 |
| 4,156,212 | 7/1979 | Covill | 333/100 |
| 4,162,475 | 7/1979 | Fisher et al. | 367/137 |
| 4,164,714 | 8/1979 | Swanson | 332/31 R X |
| 4,205,241 | 5/1980 | Fisher et al. | 330/10 X |
| 4,399,558 | 8/1983 | Smollin | 332/9 R X |
| 4,403,197 | 9/1983 | Swanson | 455/108 X |
| 4,577,165 | 3/1986 | Vehara et al. | 331/109 |
| 4,580,111 | 4/1986 | Swanson | 455/108 |
| 4,602,218 | 7/1986 | Vilmur et al. | 330/279 |
| 4,739,307 | 4/1988 | Marcovici et al. | 330/279 X |
| 4,747,159 | 5/1988 | Kato | 330/129 X |
| 4,794,343 | 12/1988 | Yang | 330/129 X |

Primary Examiner—Robert L. Griffin
Assistant Examiner—Ralph Smith
Attorney, Agent, or Firm—Tarolli, Sundheim & Covell

[57] ABSTRACT

An RF power supply serves to supply a regulated power amplified RF drive signal to an RF transmitter. The supply includes an RF oscillator for providing an RF input signal. A DC voltage source provides a DC voltage V. A plurality of power amplifiers are provided with each receiving the input RF signal and each having an input for receiving a DC voltage signal, and each serving to amplify the input RF signal by an amount dependent upon the magnitude of the DC voltage signal supplied to its input and thereby provide an amplified RF signal. The amplified RF signals are combined to provide an RF drive signal. The DC voltage V is directly supplied to the input of at least a first one of the power amplifiers. A regulating means serves to regulate the magnitude of the RF drive signal with the regulating means including circuitry for applying a fractional portion of the DC voltage V to the input of at least a second one of the power amplifiers with the fractional portion varying as a function of any variation in the magnitude of the DC drive signal with respect to a desired magnitude thereof.

6 Claims, 2 Drawing Sheets

RF POWER SUPPLY FOR SUPPLYING A REGULATED POWER AMPLIFIED UNMODULATED DRIVE SIGNAL TO AN RF MODULATOR

BACKGROUND AND FIELD OF THE INVENTION

This invention relates to the art of regulated power supplies for supplying RF drive to a load, such as a radio transmitter.

Whereas the invention will be described in conjunction with providing an RF drive for an AM transmitter, it is to be appreciated that the RF drive may also be utilized in an FM transmitter for use in radio broadcasting or an FM transmitter for the audio portion of a TV transmitter.

It is known in the art to provide an RF drive to the power amplifier stage in an AM transmitter. The RF drive typically receives an RF signal from an oscillator and amplifies the signal prior to employing it as a drive to a power amplifier. The RF drive includes a plurality of power amplifiers each supplied with an identical regulated DC voltage and each serving to provide amplification of the input RF signal. The amplified RF signals are then combined as an RF drive to be supplied to the power amplifier stage of the AM transmitter. Thus, the RF drive is the sum of the outputs of each of the amplifiers in the driver.

In the absence of drive regulation, the RF drive may vary somewhat with power line voltage resulting in variations of the regulated DC voltage supply, temperature variations taking place within the amplifiers in the driver, as well as variations in the performance of the RF oscillator. It has been known in the art to employ complex switching regulators or low efficiency linear regulators in an attempt to regulate the complete RF driver.

The U.S. Pat. No. 4,439,744 to M. Kumar et al., discloses a variable power amplifier employing a plurality of power amplifiers, each producing a different power level. Depending upon the total power level desired, one or more of the amplifiers is turned on to provide the desired output power. Each of the power amplifiers is either fully on or fully off and there is no sampling of the output RF drive to determine variations from a desired level for use in controlling a linear amplifier for supplying a DC voltage of a magnitude in accordance therewith to one of the power amplifiers for providing a regulated RF drive, as is accomplished in accordance with the present invention.

SUMMARY OF THE INVENTION

It is an object of the present invention to provide an improved RF driver power supply for supplying a regulated RF drive to a load, such as a transmitter, in such a manner to make the RF drive independent of power line voltage variations and thereby maintain very low transmitter distortion.

It is a still further object of the present invention to provide a sequenced linear regulator to regulate part of the RF drive to thereby attain a simple low cost efficient drive regulator.

In accordance with the present invention, the improved RF driver power supply serves to supply a regulated power amplified RF drive signal to an RF transmitter. An RF oscillator provides an RF input signal and a DC voltage source provides a DC voltage V. A plurality of power amplifiers each receive the input RF signal and each has an input for receiving a DC voltage signal and each serves to amplify the input RF signal by an amount dependent upon the magnitude of the DC voltage signal supplied to the input thereof so as to thereby provide an amplified RF signal. The amplified RF signals are combined so as to provide an RF drive signal. The DC voltage V is directly supplied to the input of at least a first one of the power amplifiers. A regulator serves to regulate the magnitude of the RF drive signal. This regulator includes means for applying a fractional portion of the DC voltage V to the input of at least a second one of the power amplifiers with the fractional portion varying as a function of any variation in the magnitude of the DC drive signal with respect to a desired magnitude thereof.

In accordance with a more limited aspect of the present invention, the regulator includes means for sampling the RF drive signal and providing a sample signal having a magnitude dependent upon that of the RF drive signal. A first error signal is provided having a magnitude dependent upon the difference between the sample signal and a first reference level. A first linear amplifier is coupled to the voltage source V for providing a fractional portion thereof in accordance with the magnitude of the error signal for application to the input of a second one of the power amplifiers so as to thereby provide a regulated RF drive signal.

BRIEF DESCRIPTION OF THE DRAWINGS

The foregoing and other objects and advantages of the present invention will become more readily apparent from the following detailed description as taken in conjunction with the accompanying drawings, wherein.

DESCRIPTION OF THE PREFERRED EMBODIMENT

Figure 1:
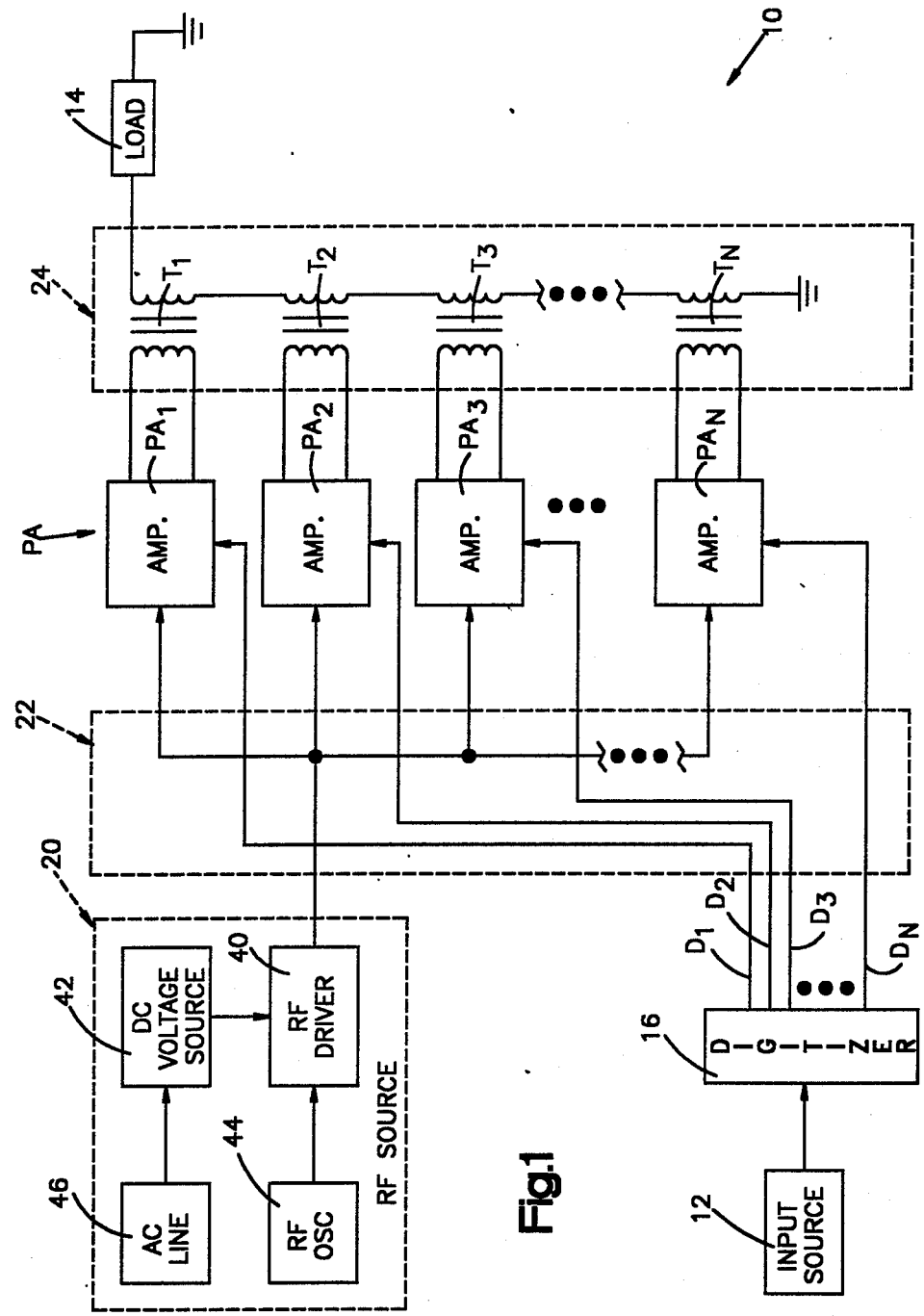
FIG. 1 is a schematic-block diagram of one application to which the present invention may be applied.

Reference is now made to the drawings which present a preferred embodiment of the present invention. One application of the present invention is an improved RF drive for an AM broadcasting transmitter operable over a frequency band on the order of 500 to 1600 KHz. An example of such an application is illustrated in FIG. 1 to which reference is now made. This example takes the form of a digital amplitude modulator, such as that illustrated and described in my U.S. Pat. No. 4,580,111, which issued Apr. 1, 1986 and which is assigned to the same assignee as the present invention. Such a modulator is particularly useful as a high power amplitude modulator for use in AM radio or TV broadcasting.

Referring now to FIG. 1, the amplitude modulator 10 is illustrated as receiving an input signal from an input source 12 which may be the source of an audio signal. The modulator 10 provides an output RF carrier signal which is amplitude modulated as a function of the amplitude of the input signal from source 12. The amplitude modulated carrier signal is provided on an output line connected to a load 14, which may take the form of an RF transmitting antenna. As brought in my aforesaid U.S. patent, a digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1-DN is supplied to one of a plurality of N RF power amplifiers $PA_1$--$PA_N$ of a power amplifier stage PA. The control signals serve to turn an associated power amplifier either on or off. Thus, if the control signal has a binary 1 level, then its associated amplifier is inactive and no signal is provided at its output. However, if the control signal is a binary 0 level, then the power amplifier is active and an amplified carrier signal is provided as its output. Each power amplifier has an input connected to a single common RF source 20. The RF source 20 serves as the single source of an RF carrier signal which is supplied by way of an RF splitter 22 so that each amplifier $PA_1$-$PA_N$ receives a signal of like amplitude and phase and frequency. These signals are supplied to a combiner circuit 24 comprised of a plurality of transformers $T_1$, $T_2$, $T_3$, ... $T_N$. The secondary windings act as an independent signal source whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

It is common in broadcast transmitters such as that illustrated in FIG. 1 that the RF carrier signal supplied to the power amplifier stage PA be preamplified. Consequently, as is shown in FIG. 1, the RF source 20 includes an RF driver 40 which is powered by a high voltage from a DC voltage source 42 for amplifying the RF signal obtained from an RF oscillator 44. The DC voltage source 42 may typically take the form of a regulated power supply which converts power taken from an AC line source 46 and converts it into regulated DC voltage, such as on the order of 230 volts. The RF driver 40 may have several stages each supplied with the regulated DC voltage from source 42 for providing pre-amplification of the RF carrier signal.

In the absence of drive regulation, the output of the RF driver may cause transmitter distortion. Thus, the output of an unregulated driver may not be constant, but will vary somewhat in dependence upon temperature variations of the amplifier stages within the RF driver or vary because of variations in the DC voltage supplied by source 42 because of fluctuations in the line voltage or may vary somewhat because of the variations in the accuracy of the RF oscillator 44. Prior art attempts to regulate the RF driver have included complex switching regulators or low efficiency linear regulators to regulate the complete RF driver. In accordance with the present invention, there is provided a sequenced linear regulator to regulate a part of the driver and thus obtain a simple low cost efficient drive regulator so as to make the RF drive independent of power line voltage and the like, and thereby maintain very low transmitter distortion.

Figure 2:
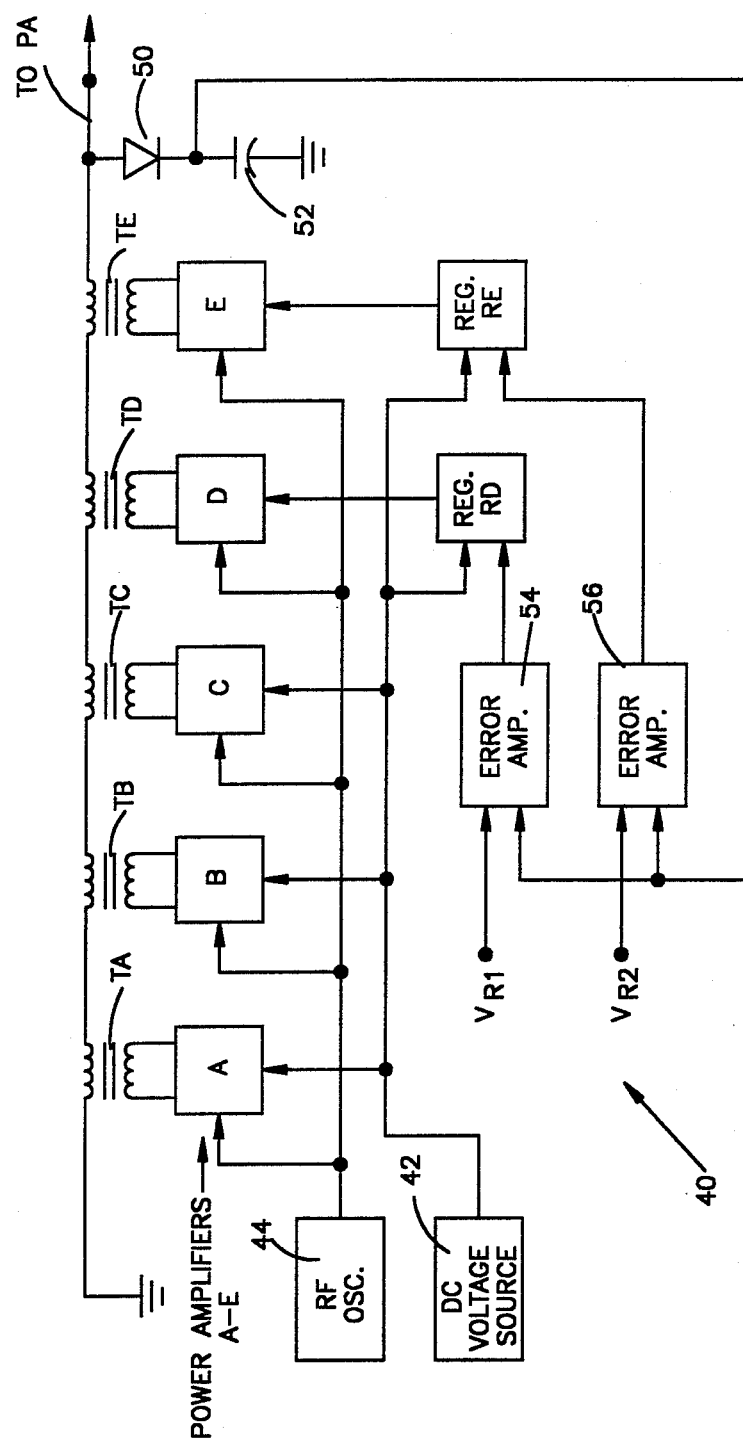
FIG. 2 is a schematic-block diagram of the preferred embodiment of the invention.

Attention is now directed to FIG. 2 which illustrates the improved RF driver 40 in accordance with one embodiment of the present invention. The RF driver 40 includes a plurality of RF power amplifiers A, B, C, D and E. Each of these amplifiers serves to amplify the RF carrier signal obtained from the RF oscillator 44. The amplified output signals are supplied to respective transformers TA, TB, TC, TD, and TE. The secondary windings act as an independent signal source whereby the signals provided by the various transformers additively combine with one another to produce a combined RF drive signal which is supplied to the power amplifier stage PA of FIG. 1. It will be noted that amplifiers A, B and C are each directly connected to the DC voltage source 42 whereas amplifiers D and E are indirectly connected to the voltage source by way of linear regulators RD and RE, respectively. Each of these amplifiers A-E may take the form of a class D MOSFET transistor amplifier. A suitable amplifier for this purpose may take the form as illustrated in FIG. 2 of my aforesaid U.S. Pat. No. 4,580,111, the description of which is herein incorporated by reference. Such an amplifier includes MOSFET transistors which effectively act as switches and are preferably connected in a bridge circuit. The amplifiers A, B and C are constantly turned on and operate in a saturated state. This amplifies the RF input signal by a fixed amount, the magnitude of the output signal being dependent upon that of the DC voltage source 42. Consequently, the outputs obtained from the amplifiers A, B and C are equal and are combined by means of transformers TA, TB and TC.

In accordance with the present invention, power amplifiers D and E are constructed the same as amplifiers A, B and C and each serves to amplify the RF input signal obtained from oscillator 44. Whereas amplifiers D and E are also class D amplifiers that operate in saturation in the manner of a switch, the magnitude of the output signals derived therefrom are limited in dependence upon the regulated DC voltage obtained from regulators RD and RE, respectively, in such a manner as to regulate the RF drive supplied by the driver of FIG. 2 to the power amplifier stage PA of FIG. 1.

In accordance with the invention, the output of the driver 40 is sampled as with a diode 50 and a capacitor 52 to provide a DC sample signal which is supplied to error amplifiers 54 and 56. The DC sample signal at each error amplifier is compared with a DC reference voltage to obtain a DC error signal having a magnitude dependent upon the difference of the input signals to the error amplifier. The DC error signal is then supplied to an associated one of the control regulators RD and RE. Each of the control regulators is also supplied with a DC voltage from the DC voltage source 42 and each regulator operates as a linear amplifier for supplying a DC output voltage which is a fraction of that obtained from the DC voltage source 42 with the fraction being dependent upon the magnitude of the error signal supplied to the regulator. Each regulator may take the form of a conventional class A linear amplifier.

The reference voltages $V_{R1}$ and $V_{R2}$ supplied to error amplifiers 54 and 56 are preferably of different levels. Thus, for example, the reference volta $V_{R2}$ may be set substantially higher than that of reference level $V_{R1}$ so that regulator RE is inactive until regulator RD approaches saturation at which time regulator RD will be supplying essentially the total magnitude of the DC voltage source 42 to the power amplifier D. At that time, the reference voltage $V_{R2}$ will provide a reference to the error amplifier 56 so that, if further correction is required, the error amplifier 56 will supply an error signal to the regulator RE to provide a fractional portion of the magnitude of the DC voltage source 42 to the power amplifier E. Consequently, regulators RD and RE provide sequenced linear regulation of the DC voltage supplied to amplifiers D and E and, hence, the regulated control of the RF drive output signal.

It should be noted that if there are no error signals provided by error amplifiers 54 and 56, then, the DC voltage supplied by regulators RD and RE to power amplifiers D and E will be 0 and, hence, only power amplifiers A, B and C will be active. This presents an operation which will be 60% of the maximum output of the RF driver 40. If, for some reason, one of the power amplifiers A, B or C becomes inactive, the circuit will cause power amplifier D to be turned on in accordance with the error signal developed by the error amplifier 54. If a 60% of maximum output is desired, then, regulator RD will be driven to a saturation level supplying the full value of the DC voltage from the DC voltage source 42 to the power amplifier D. This will restore the desired 60% of maximum output operation. If, however, this level of operation is not sufficient, then, an error signal will be developed by the error amplifier 54 so that the control regulator RE will supply a fractional portion of the voltage supplied by DC voltage source 42 to the power amplifier E to raise the output to the desired RF drive level.

In one practical application of the invention, the improved RF driver power supply of FIG. 2 has been incorporated with an AM broadcast transmitter, as in FIG. 1, to operate at 10 kilowatts. Whereas the DC voltage source 42 may be on the order of 230 volts, it is appreciated that other magnitudes may be employed. Also, the reference signals $V_{R1}$ and $V_{R2}$ may be of a substantially smaller voltage such as less than 10 volts.

Although the invention has been described with respect to a preferred embodiment, it is to be noted that various modifications may be made without departing from the spirit and scope of the invention as defined by the appended claims.

Having described a preferred embodiment of the invention, I claim:

1. An RF driver power supply for supplying a regulated power amplified unmodulated RF drive signal to an RF modulator in an RF transmitter, comprising:
    an RF oscillator for providing an RF input signal;
    a DC voltage source for providing a DC voltage V;
    a plurality of power amplifiers each having a first input for receiving said input RF signal and each having a second input for receiving a DC voltage signal and each serving to amplify said input RF signal by an amount dependent upon the magnitude of a said DC voltage signal supplied to the second input thereof to provide an amplified RF signal;
    means for applying said input RF signal to each said first input;
    means for combining said amplified RF signals to provide a said unmodulated RF drive signal to be applied to a said RF modulator;
    means for applying said DC voltage V to the second input of at least a first one of said power amplifiers; and
    regulating means for regulating the magnitude of said unmodulated RF drive signal including means for applying a fractional portion of said DC voltage V to the second input of a second one of said power amplifiers with the fractional portion varying as a function of any variation in the magnitude of said unmodulated RF drive signal with respect to a desired magnitude thereof.

2. An RF driver power supply as set forth in claim 1 wherein said regulating means includes means for sampling said unmodulated RF drive signal and providing a sample signal having a magnitude dependent upon that of said unmodulated RF drive signal;
    first error signal means for receiving said sample signal and a first reference level and providing a first error signal of a magnitude dependent upon the difference in the magnitudes of said sample signal and that of said first reference level; and
    first linear amplifier regulating means coupled to said voltage source V and responsive to said error signal for providing a fractional portion of said voltage source in accordance with the magnitude of said error signal for application to the second input of said second one of said power amplifiers.

3. An RF driver power supply for supplying a regulated power amplified unmodulated RF drive signal to an RF modulator in an RF transmitter, comprising:
    an RF oscillator for providing an RF input signal;
    a DC voltage source for providing a DC voltage V;
    a plurality of power amplifiers each having a first input for receiving a voltage signal and each serving to amplify said input RF signal by an amount dependent upon the magnitude of a said DC voltage signal supplied to the second input thereof to provide an amplified RF signal;
    means for applying said input RF signal to each said first input;
    means for combining said amplified RF signals to provide a said unmodulated RF drive signal to be applied to a said RF modulator;
    means for applying said DC voltage V to the second input of at least a first one of said power amplifiers; and
    regulating means for regulating the magnitude of said unmodulated RF drive signal including means for applying a fractional portion of said DC voltage V to the second input of a second one of said power amplifiers with the fractional portion varying as a function of any variation in the magnitude of said unmodulated RF drive signal with respect to a desired magnitude thereof;
    said regulating means includes means for sampling said unmodulated RF drive signal and providing a sample signal having a magnitude dependent upon that of said unmodulated RF drive signal;
    first error signal means for receiving said sample signal and a first reference level and providing a first error signal of a magnitude dependent upon the difference in the magnitudes of said sample signal and that of said first reference level; and
    first linear amplifier regulating means coupled to said D.C. voltage V and responsive to said error signal for providing a fractional portion of said voltage V thereof in accordance with the magnitude of said error signal for application to the second input of said second one of said power amplifiers;
    said plurality of said power amplifiers includes at least a third power amplifier and wherein said regulating means includes a second error signal means for receiving said sample signal and a second reference level and providing a second error signal of a magnitude dependent upon the difference in magnitudes of said sample signal and said second reference level and wherein said magnitude of said second reference level is representative of a desired RF drive signal level greater than that obtained when the fractional portion of said voltage V is applied to the input of said second power amplifier is unity, and second linear amplifier regulating means coupled to said D.C. voltage V and responsive to said second error signal for providing a fractional portion of said voltage V in accordance with the magnitude of said second error signal for application to the second input of said third power amplifier.

4. An RF driver power supply as set forth in claim 3 wherein said plurality of power amplifiers includes a plurality of said first power amplifiers each having a said second input for receiving a DC voltage signal and wherein said means for applying said DC voltage V includes means for applying said voltage V to the said second input of each of said plurality of first power amplifiers.

5. An RF driver power supply for supplying a regulated power amplified unmodulated RF drive signal to an RF modulator in an RF transmitter, comprising:

an RF oscillator for providing an input RF signal;
a DC voltage source;
a plurality of primary power amplifiers, each connected to said voltage source and to said oscillator for amplifying said input RF signal by a fixed amount in dependence upon the magnitude of a said voltage signal so as to provide a plurality of equally amplified RF signals;
means for combining said equally amplified RF signals for providing an output unmodulated RF signal for application to a said RF modulator in said transmitter;
means for sampling said output unmodulated RF signal and providing a sample signal in accordance with the magnitude of said output unmodulated RF signal;
means for providing a first reference signal;
first error signal means for receiving said sample signal and said first reference level and providing a first error signal of a magnitude in accordance with the difference between said sample signal and said first reference signal;
first linear amplifier regulating means coupled to said DC voltage source and responsive to said first error signal for providing a first DC drive voltage V having a magnitude which is a fractional amount of said DC voltage source in dependence upon the magnitude of said first error signal;
first secondary power amplifier means for receiving said first DC drive voltage and said input RF signal for amplifying said input RF signal by an amount in dependence upon the magnitude of said first DC drive voltage to provide a first supplemental RF output signal; and
said means for combining including means for combining said first supplemental RF output signal with said output unmodulated RF signal.

6. An RF driver power supply for supplying a regulated power amplified unmodulated RF drive signal to an RF modulator in an RF transmitter, comprising:

an RF oscillator for providing an input RF signal;
a DC voltage source;
a plurality of primary power amplifiers, each connected to said voltage source and to said oscillator for amplifying said input RF signal by a fixed amount in dependence upon the magnitude of a said voltage signal so as to provide a plurality of equally amplified RF signals;
means for combining said equally amplified RF signals for providing an output unmodulated RF signal for application to a said RF modulator in said transmitter;
means for sampling said output unmodulated RF signal and providing a sample signal in accordance with the magnitude of said output unmodulated RF signal;
means for providing a first reference signal;
first error signal means for receiving said sample signal and said first reference signal and providing a first error signal of a magnitude in accordance with the difference between said sample signal and said first reference signal;
first linear amplifier regulating means coupled to said DC voltage source and responsive to said first error signal for providing a first DC drive voltage having a magnitude which is a fractional amount of said DC voltage source in dependence upon the magnitude of said first error signal;
first secondary power amplifier means for receiving said first DC drive voltage and said input RF signal for amplifying said input RF signal by an amount in dependence upon the magnitude of said first DC drive voltage to provide a first supplemental RF output signal; and
said means for combining including means for combining said first supplemental RF output signal with said output unmodulated RF signal;
means for providing a second reference signal, second means responsive to said sample signal and said second reference signal for providing a second error signal of a magnitude in accordance with the difference between said sample signal and said second reference signal;
second linear amplifier regulator means coupled to said DC voltage source and responsive to said second error signal for providing a second DC drive voltage having a magnitude which is a fractional amount of said DC voltage source dependent upon the magnitude of said second error signal;
second secondary power amplifier means for receiving said second DC drive voltage and said input RF signal for amplifying said input RF signal by an amount in dependence upon the magnitude of said second DC drive voltage to provide a second supplemental RF output signal; and
said means for combining including means for combining said second supplemental RF output signal with said output unmodulated RF signal and said first supplemental RF output signal to obtain a combined regulated power amplified unmodulated RF signal for application to a said RF modulator in said transmitter.

* * * * *

UNITED STATES PATENT AND TRADEMARK OFFICE
CERTIFICATE OF CORRECTION

PATENT NO. : 4,947,455

DATED : August 7, 1990

INVENTOR(S) : Hilmer I. Swanson

It is certified that error appears in the above-identified patent and that said Letters Patent is hereby corrected as shown below:

Column 6, Line 20, Claim 3, insert --said input RF signal and each having a second input for receiving-- after "receiving" before "a".

Column 6, Line 20, Claim 3, insert --DC-- after "a" before "voltage".

Column 7, Line 24, Claim 5, delete "a".

Column 7, Line 25, Claim 5, change "signal" to --source--.

Column 7, Line 29, Claim 5, insert --a-- after "in" before "said".

Column 7, Line 37, Claim 5, change "level" to --signal--.

Column 7, Line 44, Claim 5, delete "V".

Column 8, Line 4, Claim 6, delete "a".

Column 8, Line 5, Claim 6, change "signal" to --source--.

Column 8, Line 9, Claim 6, insert --a-- after "in" before "said".

Signed and Sealed this

Twenty-seventh Day of August, 1991

Attest:

HARRY F. MANBECK, JR.

*Attesting Officer*      *Commissioner of Patents and Trademarks*